(12) United States Patent
Peng et al.

(10) Patent No.: US 10,797,703 B2
(45) Date of Patent: Oct. 6, 2020

(54) DRIVING APPARATUS

(71) Applicant: RichWave Technology Corp., Taipei (TW)

(72) Inventors: Tien-Yun Peng, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 0 days.

(21) Appl. No.: 16/691,503

(22) Filed: Nov. 21, 2019

(65) Prior Publication Data

US 2020/0169258 A1   May 28, 2020

(30) Foreign Application Priority Data

Nov. 23, 2018  (TW) .............................. 107141806 A (51) Int. Cl.
| | | |
|---|---|---|
| *H03B 1/00* | (2006.01) | |
| *H03K 3/00* | (2006.01) | |
| *H03K 19/0185* | (2006.01) | |
| *H03K 3/037* | (2006.01) | |

(52) U.S. Cl.
CPC ..... *H03K 19/018521* (2013.01); *H03K 3/037* (2013.01)

(58) Field of Classification Search
CPC ....................... H03K 19/018521; H03K 3/037
See application file for complete search history.

(56) References Cited

U.S. PATENT DOCUMENTS

| | | | |
|---|---|---|---|
| 6,906,552 B2 * | 6/2005 | Ajit | ................. H03K 19/00315 |
| | | | 326/63 |
| 8,736,304 B2 | 5/2014 | Boerstler et al. | |
| 9,667,251 B1 | 5/2017 | Chandrasekharan et al. | |

FOREIGN PATENT DOCUMENTS

| | | |
|---|---|---|
| TW | 200723244 | 6/2007 |
| TW | 200935390 | 8/2009 |
| TW | 200947862 | 11/2009 |

OTHER PUBLICATIONS

"Office Action of Taiwan Counterpart Application", dated May 19, 2020, p1-p6.

* cited by examiner

*Primary Examiner* — Kenneth B Wells
(74) *Attorney, Agent, or Firm* — JCIPRNET (57) ABSTRACT

A driving apparatus is provided. A first stage inverter circuit and a second stage inverter circuit respectively generate a first output signal and a second output signal according to a first voltage dividing control signal and a second voltage dividing control signal, wherein the first output signal and the second output signal are respectively output to the second-stage inverter circuit and the first-stage inverter circuit to appropriately control the gate voltages of transistors of pull-up circuit and the pull-down circuit in the first-stage inverter circuit and the second-stage inverter circuit, so that source-drain voltages differences of the transistors can be more evenly distributed.

20 Claims, 6 Drawing Sheets

DRIVING APPARATUS

CROSS-REFERENCE TO RELATED APPLICATION

This application claims the priority benefit of Taiwan application Ser. No. 107141806, filed on Nov. 23, 2018. The entirety of the above-mentioned patent application is hereby incorporated by reference herein and made a part of this specification.

BACKGROUND

Field of the Invention

The invention relates to an electronic apparatus and more particularly, to a driving apparatus.

Description of Related Art

In a general driver circuit, an inverter circuit is usually used to invert or delay signals. The inverter circuit may be formed by, for example, a plurality of P-type transistors connected in series and a plurality of N-type transistors connected in series. Gates of the P-type transistors connected in series and gates of the N-type transistors connected in series may be coupled to the same input voltage to obtain an inverted voltage at an output terminal of the inverter circuit. However, when the transistors connected in series are in turned-off states, the gate voltages of the transistors are the same, which causes the voltage difference between the source and the drain of each of the transistors connected in series to be different. As a result, a part of the transistors connected in series in the inverter circuit will endure the larger voltage differences, such that the life of the transistors is reduced, and leakage currents of the transistors are increased. Moreover, it may further cause breakdown in the transistors, and the driver circuit may be incapable of driving a later stage circuit normally.

SUMMARY

A driving apparatus of the invention includes a first voltage dividing circuit, a second voltage dividing circuit, a first stage inverter circuit and a second stage inverter circuit. The first voltage dividing circuit divides the first input signal to generate a first voltage dividing control signal. The second voltage dividing circuit divides the second input signal to generate a second voltage dividing control signal, wherein the first input signal and the second input signal are inverted with respect to each other. The first stage inverter circuit is coupled to the first voltage dividing circuit and generates a first output signal according to the first voltage dividing control signal. The second stage inverter circuit is coupled to the second voltage dividing circuit and the first stage inverter circuit. The second stage inverter circuit generates a second output signal and a first driving signal according to the second voltage dividing control signal, wherein the first output signal is configured to bias the second stage inverter circuit, and the second output signal is configured to bias the first stage inverter circuit.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
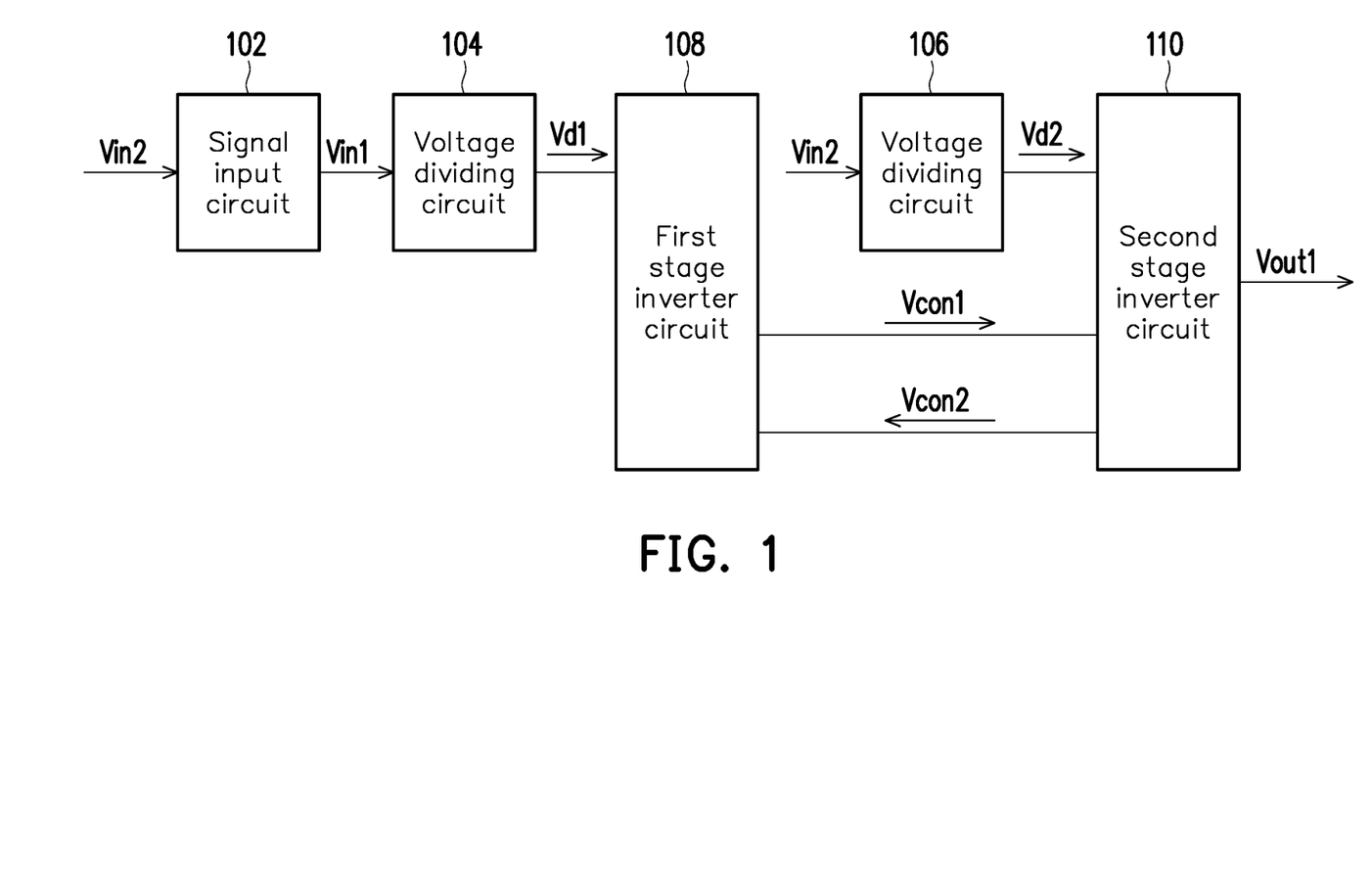
FIG. 1 is a schematic diagram illustrating a driving apparatus according to an embodiment of the invention.

FIG. 1 is a schematic diagram illustrating a driving apparatus according to an embodiment of the invention. Please refer to FIG. 1. A driving apparatus includes a signal input circuit 102, a voltage dividing circuit 104, a voltage dividing circuit 106, a first stage inverter circuit 108 and a second stage inverter circuit 110. The voltage dividing circuit 104 is coupled to the signal input circuit 102 and the first stage inverter circuit 108. The second stage inverter circuit 110 is coupled to the voltage dividing circuit 106 and the first stage inverter circuit 108. The signal input circuit 102 may receive an input signal Vin2 and invert the input signal Vin2 to generate an input signal Vin1. The input signal Vin1 and the input signal Vin2 are respectively provided to the voltage dividing circuit 104 and the voltage dividing circuit 106. The voltage dividing circuit 104 may divide the input signal Vin1 to generate a voltage dividing control signal Vd1, and the voltage dividing circuit 106 may divide the input signal Vin2 to generate a voltage dividing control signal Vd2.

In addition, the first stage inverter circuit 108 generates an output signal Vcon1 according to the voltage dividing control signal Vd1, and the second stage inverter circuit 110 generates an output signal Vcon2 and a driving signal Vout1 according to the voltage dividing control signal Vd2. The output signal Vcon1 is configured to bias the second stage inverter circuit 110, the output signal Vcon2 is configured to bias the first stage inverter circuit 108, and the driving signal Vout1 is configured to drive a later stage circuit, for example, a radio frequency (RF) switch circuit, but the invention is not limited thereto. In this way, the output signal Vcon1 and the output signal Vcon2 are respectively generated by the first stage inverter circuit 108 and the second stage inverter circuit 110 according to the voltage dividing control signal Vd1 and the voltage dividing control signal Vd2 to control the gate voltages of the transistors connected in series in the first stage inverter circuit 108 and the second stage inverter circuit 110, such that the voltage difference of the transistors in the first-stage inverter circuit 108 and the second-stage inverter circuit 110 may be distributed evenly to reduce the leakage currents of the transistors and avoid the breakdown in the transistors, so that the driving apparatus may normally drive the later stage circuit (for example, a RF switching circuit, but the invention is not limited thereto) and extend the life of the circuit.

Figure 2:
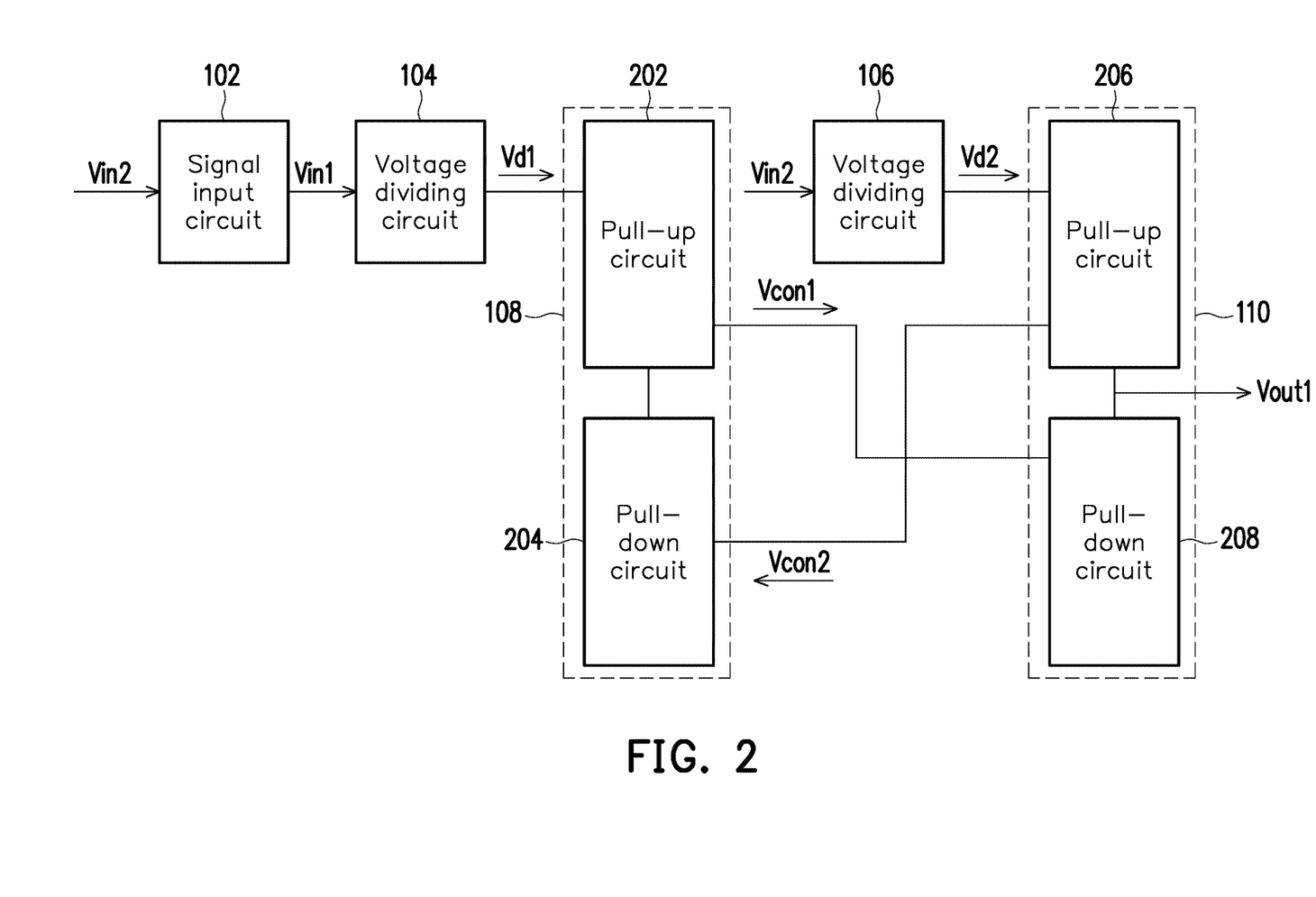
FIG. 2 is a schematic diagram illustrating a driving apparatus according to another embodiment of the invention.

FIG. 2 is a schematic diagram illustrating a driving apparatus according to another embodiment of the invention. Please refer to FIG. 2, the first stage inverter circuit 108 and the second stage inverter circuit 110 of the embodiment illustrated in FIG. 1 may respectively include pull-up circuits and pull-down circuits, as illustrated in FIG. 2. Referring to FIG. 2, a pull-up circuit 202 of the first stage inverter circuit 108 is coupled to the voltage dividing circuit 104, a pull-down circuit 204 and a pull-down circuit 208. A pull-up circuit 206 of the second stage inverter circuit 110 is coupled to the voltage dividing circuit 106, the pull-down circuit 208 and the pull-down circuit 204. The pull-up circuit 202 and the pull-up circuit 206 may respectively provide pull-up paths to change voltage levels of the output signal Vcon1, the output signal Vcon2 and the driving signal Vout1 by turning on or turning off the pull-up paths. In addition, the pull-down circuit 204 and the pull-down circuit 208 respectively provide pull-down paths to change the voltage levels of the output signal Vcon1, the output signal Vcon2 and the driving signal Vout1 by turning on or turning off the pull-down paths.

Figure 3:
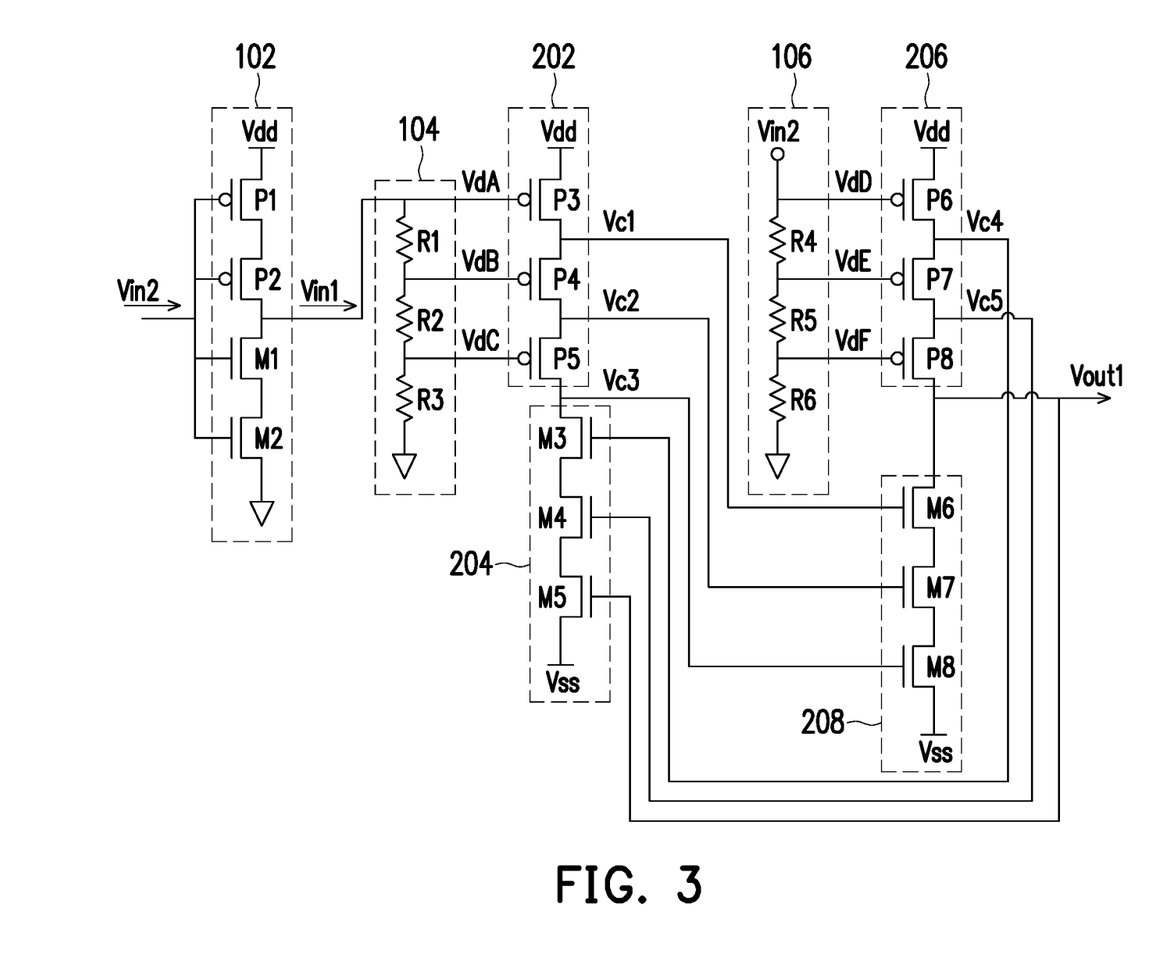
FIG. 3 is a schematic diagram illustrating a driving apparatus according to another embodiment of the invention.

In detail, the driving apparatus of the embodiment illustrated in FIG. 2 may be implemented, for example, by a circuit of the embodiment illustrated in FIG. 3. In the embodiment illustrated in FIG. 3, the signal input circuit 102 includes P-type transistors P1 and P2 and N-type transistors M1 and M2. The P-type transistors P1 and P2 and the N-type transistors M1 and M2 are connected in series between an operation voltage terminal for providing an operation voltage Vdd and a reference potential terminal for providing a reference voltage (which may be a ground voltage, but the invention is not limited thereto). The P-type transistors P1 and P2 and the N-type transistors M1 and M2 are coupled to the input signal Vin2. An inverter circuit formed by the P-type transistors P1 and P2 and the N-type transistors M1 and M2 may generate the input signal Vin1 which is inverted with respect to the input signal Vin2. In another embodiment, the P-type transistor P2 and the N-type transistor M2 may be omitted, such that the signal input circuit 102 includes the P-type transistor P1 and the N-type transistor M1 which are connected in series between the operation voltage terminal for providing the operation voltage Vdd and the reference potential terminal for providing the reference voltage.

The voltage dividing circuit 104, the voltage dividing circuit 106, the first stage inverter circuit 108 and the second stage inverter circuit 110 may be formed by, for example, an SOI process or a bulk CMOS process, but the invention is not limited thereto. The voltage dividing circuit 104 and the voltage dividing circuit 106 may respectively include a plurality of voltage dividing elements. The voltage dividing elements included in the voltage dividing circuit 104 are connected in series between an input signal terminal for providing the input signal Vin1 and the reference potential terminal for providing the reference voltage to distribute a voltage of the input signal Vin1. The voltage dividing elements included in the voltage dividing circuit 106 are connected in series between an input signal terminal providing the input signal Vin2 and the reference potential terminal for providing the reference voltage to distribute a voltage of the input signal Vin2. The voltage dividing elements may at least include, for example, resistors, diodes or transistors, but the invention is not limited thereto. In the present embodiment, the voltage dividing circuit 104 and the voltage dividing circuit 106 include resistors R1 to R3 and resistors R4 to R6, respectively. The voltage of the input signal Vin1 may be divided by the resistors R1 to R3 connected in series to generate divided voltages VdA to VdC (the divided voltages VdA to VdC are voltage signals included in the voltage dividing control signal Vd1). Similarly, the voltage of the input signal Vin2 may be divided by the resistors R4-R6 connected in series to generate divided voltages VdD to VdF (the divided voltages VdD to VdF are voltage signals included in the voltage dividing control signal Vd2). For example, the voltage of the input signal Vin1 may be, for example, 0V, and the voltage of the input signal Vin2 may be, for example, 3V, the divided voltages VdA to VdC may be, for example, 0V, and the divided voltages VdD to VdF may be, for example, 3V, 1.6V and 0V, respectively. The configuration of each of the divided voltages may be determined according to resistance values of the resistors, the number of the diodes or the sizes of the transistors in the voltage dividing elements.

The pull-up circuits and pull-down circuits may respectively include first conductivity type transistors and second conductivity type transistors. The first conductivity type transistors and the second conductivity type transistors may at least include, for example, Metal Oxide Semiconductor Field Effect Transistors (MOSFETs), Pseudomorphic High Electron Mobility Transistors (PHEMTs) or Bipolar Junction Transistors (BJTs), but the invention is not limited thereto. For example, in the present embodiment, the pull-up circuit 202 and the pull-up circuit 206 respectively include P-type transistors P3 to P5 and P-type transistors P6 to P8, and the pull-down circuit 204 and the pull-down circuit 208 respectively include N-type transistors M3 to M5 and N-type transistors M6 to M8, and the P-type transistors P3 to P5, P6-P8 and the N-type transistors M3 to M5, M6 to M8 are connected in series between the operation voltage terminal for providing the operation voltage Vdd and an operation voltage terminal for providing the operation voltage Vss, wherein the operation voltage Vdd is greater than the operation voltage Vss. Gates of the P-type transistors P3 to P5 in the pull-up circuit 202 may respectively receive the divided voltages VdA to VdC, such that the P-type transistors P3 to P5 may respectively provide the output voltages Vc1 to Vc3 from sources thereof (wherein, the output voltages Vc1 to Vc3 are voltage signals included in the output signal Vcon1). Similarly, gates of the P-type transistors P6 to P8 in the pull-up circuit 206 may respectively receive the divided voltages VdD to VdF, such that the P-type transistors P6 to P8 may respectively provide the output voltage Vc4, the output voltage Vc5 and the driving signal Vout1 from sources thereof (wherein the output voltages Vc4 and Vc5 and the driving signal Vout1 are voltage signals included in the output signal Vcon2). That is, the second pull-up circuit 206 pulls up/generates a voltage of the second output signal Vcon2 (including the driving signal Vout1) according to the divided voltages VdD to VdF of the second voltage dividing control signal. In addition, the output voltages Vc1 to Vc3 may be respectively provided to gates of the N-type transistors M6 to M8 in the pull-down circuit 208, and the output voltage Vc4, the output voltage Vc5 and the driving signal Vout1 may be respectively provided to gates of the N-type transistors M3 to M5 in the pull-down circuit 204. In this way, the voltage dividing circuits 104 and 106 are utilized to adaptively divide the voltages of the input signals Vin1 and Vin2 and to control gate voltages of the P-type transistors P3 to P8 in the pull-up circuit 202 and the pull-up circuit 206 according to the divided voltages VdA to VdF, such that voltage differences of the transistors in the pull-up circuit 206 and the pull-down circuit 204 may be equal to each other, i.e., the source-drain voltage differences of the transistors in the pull-up circuit 206 and the pull-down circuit 204 may be evenly distributed. Thereby, the driving apparatus may be prevented from being incapable of normally driving the later stage circuit due to breakdown in the transistors, leakage cuiTents of the transistors may be reduced, and the life of the transistors may be extended. In addition, in another embodiment, the source-drain voltage differences of the transistors may also not be equal to each other, that is, the voltage difference that does not cause the breakdown in the transistors is acceptable.

For example, when the operation voltage Vdd is 3V, the operation voltage Vss is -2V, the voltage of the input signal Vin1 is 0V, the voltage of the input signal Vin2 is 3V, and the resistance of each of the resistors R1 to R6 is 1MΩ, the divided voltages VdA to VdC may be 0V, and the divided voltages VdD to VdF may be, for example, 3V, 1.6V and 0V, respectively. The gates of the P-type transistors P3 to P5 in the pull-up circuit 202 are respectively controlled by the divided voltages VdA to VdC which are divided from the input signal Vin1, and are in turned-on states (i.e., the pull-up path provided by the pull-up circuit 202 is turned on), such that the output voltages Vc1 to Vc3 are equal to 3V. In addition, the gates of the N-type transistors M6 to M8 in the pull-down circuit 208 are controlled by the output voltages Vc1 to Vc3, and are in turned-on states (i.e., the pull-down path provided by the pull-down circuit 208 is turned on). That is, the turning on and turning off of the pull-down path of the pull-down circuit 208 is related to the output voltages Vc1 to Vc3 and the input signal Vin1. The gates of the P-type transistors P6 to P8 in the pull-up circuit 206 are respectively controlled by the divided voltages VdD to VdF which are divided from the input signal Vin2, and are in turned-off states (i.e., the pull-up path provided by the pull-up circuit 206 is turned off), such that the output voltage Vc4, the output voltage Vc5 and the driving signal Vout1 are equal to 1.6V, 0V and -2V, respectively. In the present embodiment, the driving signal Vout1 is in phase with the input signal Vin1 and is inverted with respect to the input signal Vin2, and thus, the driving apparatus may be substantially an inverter. In addition, the gates of the N-type transistors M3 to M5 in the pull-down circuit 204 are respectively controlled by the output voltage Vc4, the output voltage Vc5 and the driving signal Vout1 to turn off the pull-down path provided by the pull-down circuit 204. That is, the turning on and turning off of the pull-down path of the pull-down circuit 204 are responsive to the output voltage Vc4, the output voltage Vc5, the driving signal Vout1 and the input signal Vin2. In the present embodiment, since the gates of the P-type transistors P6 to P8 in the pull-up circuit 206 and the gates of the N-type transistors M3 to M5 in the pull-down circuit 204 are controlled by different voltages, the source-drain voltage differences of the P-type transistors P6 to P8 and the N-type transistors M3 to M5 may be adaptively adjusted to avoid a part of the transistors enduring the larger voltage differences in the pull-up circuit 206 and the pull-down circuit 204 when the pull-up path provided by the pull-up circuit 206 and the pull-down path provide by the pull-down circuit 204 are turned off. In this way, the driving apparatus may be prevented from being incapable of normally driving the later stage circuit due to the breakdown in the transistors, the leakage currents of the transistors may be effectively reduced and the life of the transistors may be extended. By deriving by analogy, when the voltage of the input signal Vin1 is 3V and the voltage of the input signal Vin2 is 0V, the voltages of the input signals Vin1 and Vin2 may also be adaptively divided by the voltage dividing circuits 104 and 106, such that the voltage differences of the transistors in the pull-up circuits and the pull-down circuits of which the paths are turned off may be evenly distributed, but the related details will-no not be repeatedly described.

Figure 4:
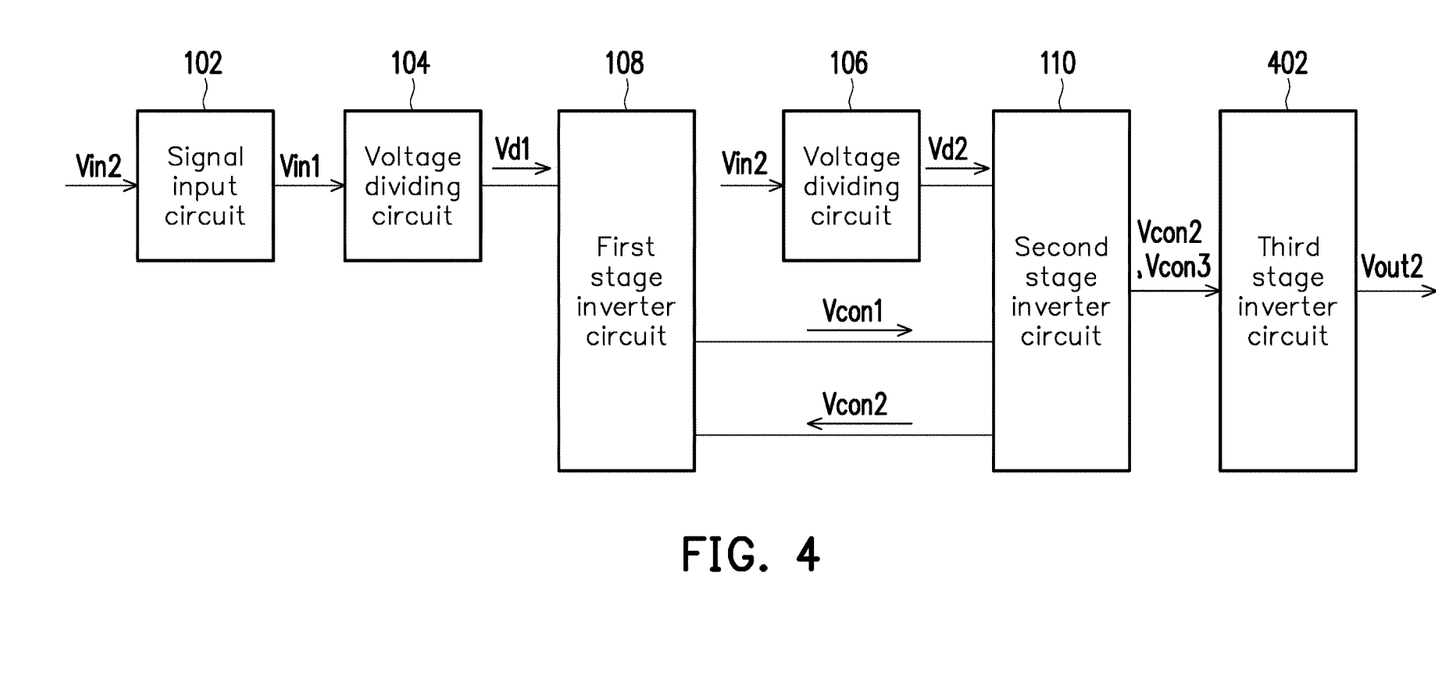
FIG. 4 is a schematic diagram illustrating a driving apparatus according to another embodiment of the invention.
Figure 5:
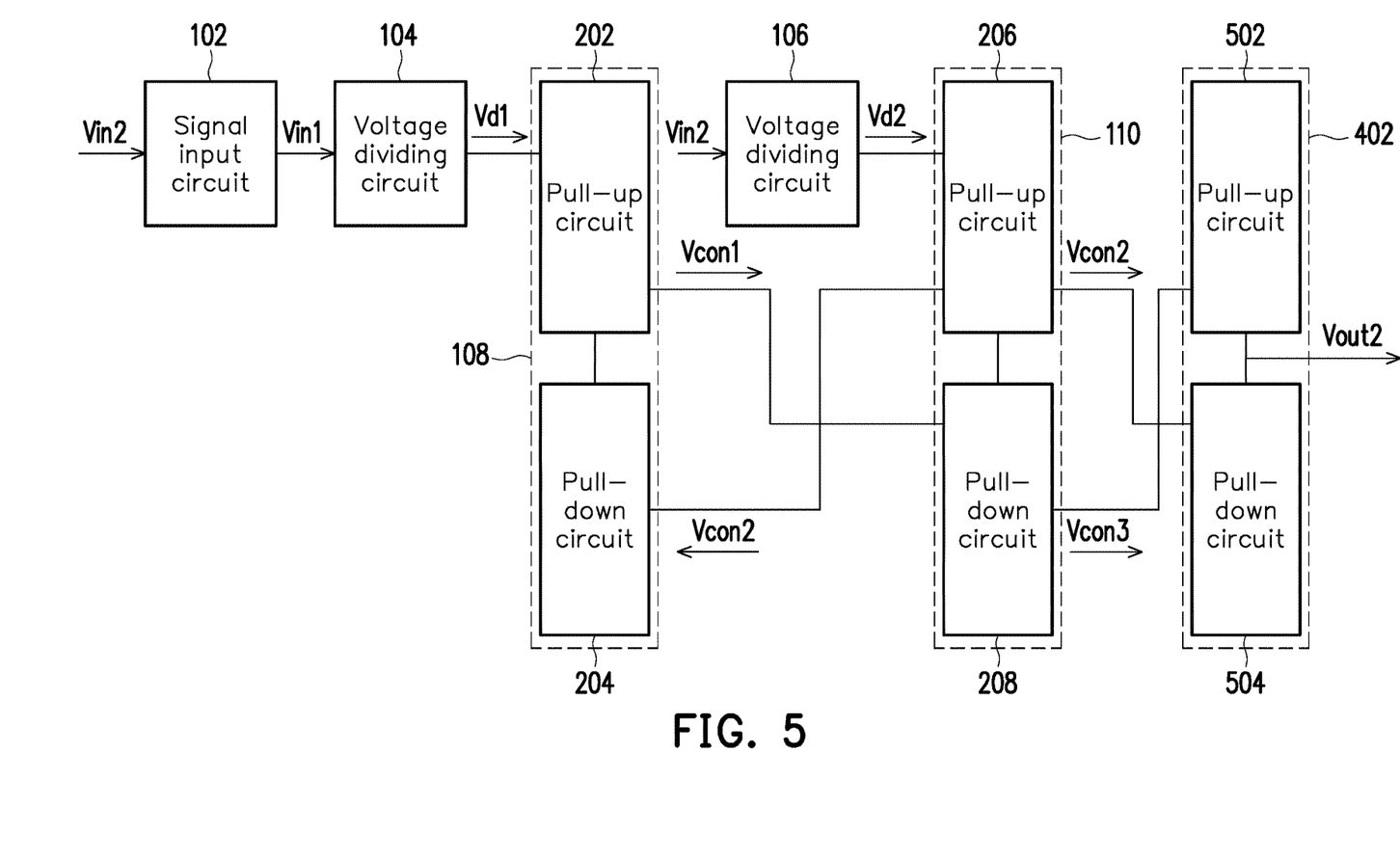
FIG. 5 is a schematic diagram illustrating a driving apparatus according to another embodiment of the invention.

It should be noted that in other embodiments, the driving apparatus is not limited to have only two stages of inverter circuits as that in the embodiments described above, and the driving apparatus may also have more stages of inverter circuits. FIG. 4 is a schematic diagram lustrating a driving apparatus according to another embodiment of the invention. The embodiment in FIG. 4 is different from the embodiment in FIG. 1 in that the driving apparatus illustrated in FIG. 4 further includes a third stage inverter circuit 402 which is coupled to the second stage inverter circuit 110. In the present embodiment, the second stage inverter circuit may generate output signals Vcon2 and Vcon3 according to the voltage dividing control signal Vd2 and the output signal Vcon 1. The third stage inverter circuit 402 may generate a driving signal Vout2 according to the output signals Vcon2 and Vcon3 to drive a later stage circuit (for example, an RF switch circuit, which is not limited in the invention). Similarly, as illustrated in FIG. 5, the third stage inverter circuit 402 may also include a pull-up circuit 502 and a pull-down circuit 504. A common terminal of the pull-up circuit 502 and the pull-down circuit 504 generates the driving signal Vout2. The pull-up circuit 502 may provide a pull-up path for pulling up a voltage of the driving signal Vout2. Turning on and turning off of the pull-up path of the pull-up circuit 502 for pulling up the voltage of the driving signal Vout2 is related to the input signal Vin1 and the output signal Vcon3. The pull-down circuit 504 may provide a pull-down path for pulling down the voltage of the driving signal Vout2. Turning on and turning off of the pull-down path of the pull-down circuit 504 for pulling down the voltage of the driving signal Vout2 is related to the input signal Vin2 and the output signal Vcon2.

Figure 6:
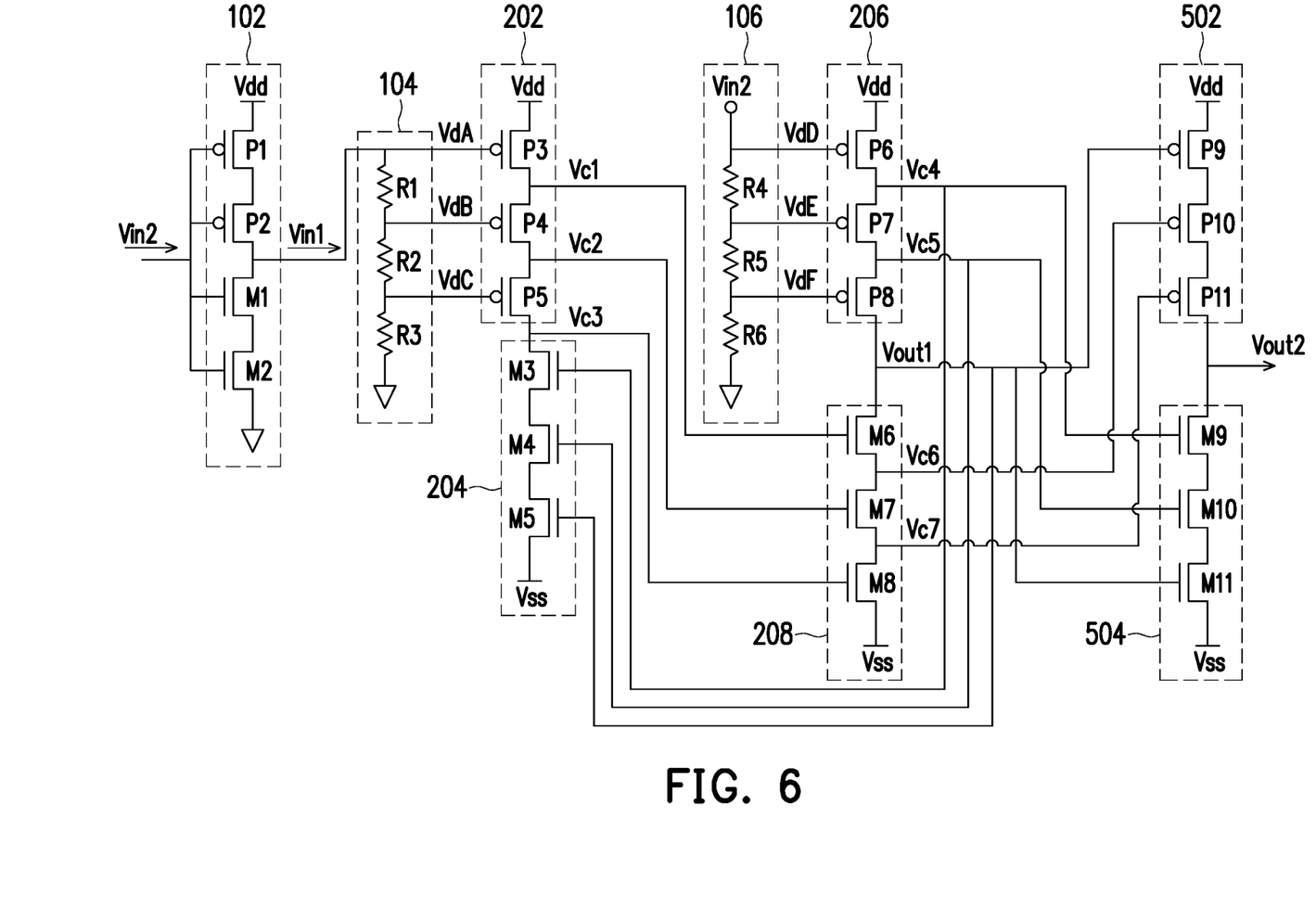
FIG. 6 is a schematic diagram illustrating a driving apparatus according to another embodiment of the invention.

In detail, the driving apparatus of the embodiment illustrated in FIG. 5 may be implemented by, for example, a circuit of the embodiment illustrated in FIG. 6. In the embodiment illustrated in FIG. 6, implementation of the signal input circuit 102, the voltage dividing circuit 104, the voltage dividing circuit 106, the pull-up circuit 202, the pull-up circuit 206, the pull-down circuit 204 and the pull-down circuit 208 are the same as those in the embodiment illustrated in FIG. 5 and thus will not be repeatedly described. Similarly, the pull-up circuit 502 and the pull-down circuit 504 of the embodiment illustrated in FIG. 6 may respectively include first conductivity type transistors and second conductivity type transistors. The first conductivity type transistors and the second conductivity type transistors may at least include, for example, Metal Oxide Semiconductor Field Effect Transistors (MOSFETs), Pseudomorphic High Electron Mobility Transistors (PHEMTs) or Bipolar Junction Transistors (BJTs), but the invention is not limited. For example, in the present embodiment, the pull-up circuit 502 and the pull-down circuit 504 include P-type transistors P9-P11 and N-type transistors M9-M11 which are connected in series between the operation voltage terminal for providing the operation voltage Vdd and the operation voltage terminal for providing the operation voltage Vss. Gates of the P-type transistors P9 to P11 are controlled by the driving signal Vout1, an output voltage Vc6 and an output voltage Vc7 (wherein the driving signal Vout1, the output voltage Vc6 and the output voltage Vc7 are voltage signals included in the output signal Vcon3). When a pull-down path of the N-type transistors M6 to M8 in the pull-down circuit 208 is turned on, voltages of the driving signal Vout1, the output voltage Vc6 and the output voltage Vc7 are pulled down to the operation voltage Vss, such that the P-type transistors P9-P11 in the pull-up circuit 502 are turned on, i.e., the pull-up path provided by the pull-up circuit 502 is turned on. In addition, gates of the N-type transistors M9 to M11 are controlled by the output voltage Vc4, the output voltage Vc5 and the driving signal Vout1 provided by the pull-up circuit 206 (wherein the driving signal Vout1, the output voltage Vc4 and the output voltage Vc5 are voltage signals included in the output signal Vcon2) and are in turned-off states (i.e., the pull-down path provided by the pull-down circuit 504 is turned off). That is, turning on and turning off of the pull-up path of the pull-up circuit 502 are responsive to the output voltage Vc6, the output voltage Vc7, the driving signal Vout1 and the input signal Vin1, and turning on and turning off of the pull-down path of the pull-down circuit 504 are responsive to the output voltage Vc4, the output voltage Vc5, the driving signal Vout1 and the input signal Vin2. The driving signal Vout1 is related to the output signals Vcon2 and Vcon3. According to the embodiments above, when the pull-down path in the pull-down circuit 504 is turned off, the output voltage Vc4, the output voltage Vc5 and the driving signal Vout1 may be adaptively adjusted by the dividing of the voltage dividing circuit 106, such that source-drain voltage differences of the N-type transistors M9 to M11 may be evenly distributed to avoid a part of the transistors enduring the larger voltage differences. Following the example provided in the embodiment illustrated in FIG. 3, when the operation voltage Vdd is 3V, the operation voltage Vss is -2V, the voltage of the input signal Vin1 is 0V, and the voltage of the input signal Vin2 is 3V, the voltages of the driving signal Vout1, the output voltages Vc6 and Vc7 will be -2V, and a voltage level of the driving signal Vout2 will be 3V to drive the later stage circuit. In the present embodiment, the driving signal Vout2 is inverted with respect to the input signal Vin1 and is in phase with the input signal Vin2, and thus, the driving apparatus may be substantially an inverter.

The embodiments of present invention utilize the voltage dividing circuits to adaptively divide the input voltages and control the gate voltages of the transistors in the pull-up circuit and the pull-down circuit in the inverter circuits according to the divided voltages which are divided from the voltages of the input signals. Even in the case where the driving apparatus has more stages of inverter circuits, the source-drain voltage differences of the transistors of the pull-up circuits and the pull-down circuits in which the paths are turned off in the inverter circuits of the respective stages are relatively close or equal. That is, the voltage differences of the transistors may be more evenly distributed to avoid a part of the transistors enduring the larger voltage differences. In this way, the driving apparatus can be prevented from being incapable of normally driving the later stage circuit due to the breakdown in the transistors, the leakage currents of the transistors can be reduced, and the life of the transistors can be extended.

Although the invention has been described with reference to the above embodiments, it will be apparent to one of ordinary skill in the art that modifications to the described embodiment may be made without departing from the spirit of the invention. Accordingly, the scope of the invention will be defined by the attached claims and not by the above detailed descriptions.

What is claimed is:

1. A driving apparatus, comprising:
   a first voltage dividing circuit, dividing a first input signal to generate a first voltage dividing control signal;
   a second voltage dividing circuit, dividing a second input signal to generate a second voltage dividing control signal, wherein the first input signal and the second input signal are inverted with respect to each other;
   a first stage inverter circuit, coupled to the first voltage dividing circuit and generating a first output signal according to the first voltage dividing control signal; and
   a second stage inverter circuit, coupled to the second voltage dividing circuit and the first stage inverter circuit, and the second stage inverter circuit generating a second output signal and a first driving signal according to the second voltage dividing control signal, wherein the first output signal is configured to bias the second stage inverter circuit, and the second output signal is configured to bias the first stage inverter circuit.

2. The driving apparatus according to claim 1, wherein the second stage inverter circuit further generates a third output signal according to the second voltage dividing control signal and the first output signal, and the driving apparatus further comprises:
   a third stage inverter circuit, coupled to the second stage inverter circuit and generating a second driving signal according to the second output signal and the third output signal.

3. The driving apparatus according to claim 2, wherein the third stage inverter circuit outputs the second driving signal to a radio frequency (RF) switch circuit.

4. The driving apparatus according to claim 1, wherein the first stage inverter circuit comprises:
   a first pull-up circuit, coupled to the first voltage dividing circuit and generating a voltage of the first output signal according to the first voltage dividing control signal; and
   a first pull-down circuit, coupled to the first pull-up circuit and the second stage inverter circuit, wherein turning on and turning off of a first pull-down path provided by the first pull-down circuit are responsive to the second input signal.

5. The driving apparatus according to claim 4, wherein the second stage inverter circuit comprises:
   a second pull-up circuit, coupled to the second voltage dividing circuit and the first pull-down circuit, and generating voltages of the second output signal and the first driving signal according to the second voltage dividing control signal; and
   a second pull-down circuit, coupled to the second pull-up circuit and the first pull-up circuit, wherein a common terminal of the second pull-up circuit and the second pull-down circuit generates the first driving signal, and turning on and turning off of a second pull-down path provided by the second pull-down circuit are responsive to the first input signal.

6. The driving apparatus according to claim 5, wherein the first voltage dividing control signal comprises a plurality of first divided voltages, the second voltage dividing control signal comprises a plurality of second divided voltages, the first output signal comprises a plurality of first output voltages, the second output signal comprises a plurality of second output voltages, the first pull-up circuit and the second pull-up circuit respectively comprise a plurality of first conductivity type transistors connected in series, and the first pull-down circuit and the second pull-down circuit respectively comprise a plurality of second conductivity type transistors connected in series, wherein turned-on states of the first conductivity type transistors included in the first pull-up circuit are respectively controlled by the corresponding first divided voltages to generate the first output voltages, turned-on states of the first conductivity type transistors included in the second pull-up circuit are respectively controlled by the corresponding second divided voltages to generate the second output voltages, turned-on states of the second conductivity type transistors included in the first pull-down circuit are respectively controlled by the corresponding second output voltages, and turned-on states of the second conductivity type transistors included in the second pull-down circuit are respectively controlled by the corresponding first output voltages.

7. The driving apparatus according to claim 6, wherein the first voltage dividing circuit comprises a plurality of first voltage dividing elements, the first voltage dividing elements are connected in series between an input terminal of the first stage inverter circuit and a reference potential terminal to distribute a voltage of the first input signal to generate the first divided voltages, the second voltage dividing circuit comprises a plurality of second voltage dividing elements, the second voltage dividing elements are connected in series between an input terminal of the second stage inverter circuit and the reference potential terminal to distribute a voltage of the second input signal to generate the second divided voltages.

8. The driving apparatus according to claim 7, wherein the voltage dividing elements at least comprise resistors, diodes or transistors.

9. The driving apparatus according to claim 6, wherein the first conductivity type transistors and the second conductivity type transistors comprise metal oxide semiconductor transistors, pseudomorphic high electron mobility transistors or bipolar junction transistors.

10. The driving apparatus according to claim 5, wherein the second pull-down circuit further generates a third output signal according to the first output signal, and the driving apparatus further comprises:
  a third stage inverter circuit, comprising:
    a third pull-up circuit, coupled to the second pull-down circuit; and
    a third pull-down circuit, coupled to the third pull-up circuit and the second pull-up circuit, wherein a common terminal of the third pull-up circuit and the third pull-down circuit generates a second driving signal, turning on and turning off of a third pull-up path provided by the third pull-up circuit is related to the first input signal, and turning on and turning off of a third pull-down path provided by the third pull-down circuit are responsive to the second input signal.

11. The driving apparatus according to claim 10, wherein the first voltage dividing control signal comprises a plurality of first divided voltages, the second voltage dividing control signal comprises a plurality of second divided voltages, the first output signal comprises a plurality of first output voltages, the second output signal comprises a plurality of second output voltages, the third output signal comprises a plurality of third output voltages, the first pull-up circuit, the second pull-up circuit and the third pull-up circuit respectively comprise a plurality of first conductivity type transistors connected in series, and the first pull-down circuit, the second pull-down circuit and the third pull-down circuit respectively comprise a plurality of second conductivity type transistors connected in series, wherein turned-on states of the first conductivity type transistors included in the first pull-up circuit are respectively controlled by the corresponding first divided voltages to generate the first output voltages, turned-on states of the first conductivity type transistors included in the second pull-up circuit are respectively controlled by the corresponding second divided voltages to generate the second output voltages, turned-on states of the second conductivity type transistors included in the first pull-down circuit are respectively controlled by the corresponding second output voltages, turned-on states of the second conductivity type transistors included in the second pull-down circuit are respectively controlled by the corresponding first output voltages to generate the third output voltages, turned-on states of the first conductivity type transistors included in the third pull-up circuit are respectively controlled by the corresponding third output voltages, and turned-on states of the second conductivity type transistors included in the third pull-down circuit are respectively controlled by the corresponding second output voltages.

12. The driving apparatus according to claim 11, wherein the first voltage dividing circuit comprises a plurality of first voltage dividing elements, the first voltage dividing elements are connected in series between an input terminal of the first stage inverter circuit and a reference potential terminal to distribute a voltage the first input signal to generate the first divided voltages, the second voltage dividing circuit comprises a plurality of second voltage dividing elements, and the second voltage dividing elements are connected in series between an input terminal of the second stage inverter circuit and the reference potential terminal to distribute a voltage of the second input signal to generate the second divided voltages.

13. The driving apparatus according to claim 12, wherein the voltage dividing elements at least comprise resistors, diodes or transistors.

14. The driving apparatus according to claim 11, wherein the first conductivity type transistors and the second conductivity type transistors comprise metal oxide semiconductor transistors, pseudomorphic high electron mobility transistors or bipolar junction transistors.

15. The driving apparatus according to claim 1, wherein the second stage inverter circuit outputs the first driving signal to an RF switch circuit.

16. The driving apparatus according to claim 1, further comprising:
  a signal input circuit, having an output terminal coupled to the first voltage dividing circuit, and the signal input circuit inverting the second input signal to generate the first input signal.

17. The driving apparatus according to claim 16, wherein the signal input circuit comprises:
  a P-type transistor; and
  an N-type transistor,
  wherein the P-type transistor and the N-type transistor are connected in series between an operation voltage terminal and a reference potential terminal, gates of the P-type transistor and the N-type transistor receive the second input signal, and a common terminal of the P-type transistor and the N-type transistor generates the first input signal.

18. The driving apparatus according to claim 1, wherein the first voltage dividing circuit, the second voltage dividing circuit, the first stage inverter circuit and the second stage inverter circuit are formed by an SOI process or a bulk CMOS process.

19. The driving apparatus according to claim 1, wherein the first driving signal is in phase with the first input signal and is inverted with respect to the second input signal.

20. The driving apparatus according to claim 2, wherein the second driving signal is inverted with respect to the first input signal and is in phase with the second input signal.

* * * * *